(12) United States Patent
Rea et al.

(10) Patent No.: US 7,579,824 B2
(45) Date of Patent: Aug. 25, 2009

(54) HIGH-PRECISION ROGOWSKI CURRENT TRANSFORMER

(75) Inventors: David Rea, Pittsford, NY (US);
Kenneth L. Kaye, Fairport, NY (US);
Michael F. Zawisa, Victor, NY (US)

(73) Assignee: GM Global Technology Operations, Inc., Detroit, MI (US)

( * ) Notice: Subject to any disclaimer, the term of this patent is extended or adjusted under 35 U.S.C. 154(b) by 29 days.

(21) Appl. No.: 11/536,769

(22) Filed: Sep. 29, 2006

(65) Prior Publication Data

US 2008/0079418 A1 Apr. 3, 2008

(51) Int. Cl.
*G01R 15/18* (2006.01)
*H01F 5/00* (2006.01)

(52) U.S. Cl. ............... 324/117 R; 324/158.1; 336/200; 336/220; 336/225

(58) Field of Classification Search ............ 336/174, 336/200–232; 324/117 R, 127
See application file for complete search history.

(56) References Cited

U.S. PATENT DOCUMENTS

| | | | | |
|---|---|---|---|---|
| 5,414,400 A | * | 5/1995 | Gris et al. | 336/174 |
| 6,914,509 B2 | * | 7/2005 | Yu et al. | 336/200 |
| 7,078,888 B2 | * | 7/2006 | Budillon et al. | 324/127 |
| 7,106,162 B2 | * | 9/2006 | Saito | 336/229 |
| 7,227,442 B2 | * | 6/2007 | Skendzic | 336/229 |
| 7,369,028 B2 | * | 5/2008 | Matsunaga et al. | 336/200 |
| 2003/0214313 A1 | * | 11/2003 | Omura et al. | 324/713 |

\* cited by examiner

*Primary Examiner*—Ha Tran T Nguyen
*Assistant Examiner*—Emily Y Chan
(74) *Attorney, Agent, or Firm*—Fraser Clemens Martin & Miller LLC; J. Douglas Miller

(57) ABSTRACT

A high-precision Rogowski current transformer, the Rogowski coil is realized in a single printed circuit board while maintaining both the outside field rejection of a traditional Rogowski coil, and the increased output voltage similar to the multiple printed circuit board Rogowski coil arrangements.

20 Claims, 4 Drawing Sheets

HIGH-PRECISION ROGOWSKI CURRENT TRANSFORMER

FIELD OF THE INVENTION

This invention relates to a Rogowski current transformer. More particularly, the invention is directed to a Rogowski current transformer realized on a printed circuit board.

BACKGROUND SUMMARY

In order to measure the AC current passing through a solid bus bar, it is desirable to have a Rogowski-type coil on a printed circuit board that is rigid and may be mounted on the bus bar.

Current efforts to realize a Rogowski coil on a printed circuit board employ multiple coils on multiple printed circuit boards. The coils can be arranged to cancel the effects of outside magnetic fields when the coils are wired in series in electrically opposite directions. This method is similar to a traditional Rogowski coil where passing a single Rogowski coil's conductor back through the coil's helical windings provides outside field rejection and cancellation.

In such Rogowski coils the use of multiple printed circuit boards effectively increases the turns-count of the Rogowski coil, providing the benefit of increased output voltage. However, the use of multiple printed circuit boards also increases the overall cost and complexity. Furthermore, the interconnects required to link the multiple coil printed circuit boards introduce additional failure points in the Rogowski current transducer system reducing reliability.

It would be desirable to have a Rogowski coil realized in a single printed circuit board, that provided both the outside field rejection of a traditional Rogowski coil, and the increased output voltage similar to the multiple printed circuit board Rogowski coil arrangements.

SUMMARY OF THE INVENTION

According to the present invention, a Rogowski coil realized in a single printed circuit board having both the increased output voltage of the multiple printed circuit board Rogowski coil arrangements, and outside field rejection of a traditional and multiple printed circuit board Rogowski coil arrangements has surprisingly been discovered.

In one embodiment, the apparatus for measuring current in a conductor has a printed circuit board having a plurality of discrete substrate layers, an outer coil wound around at least one of the substrate layers, an inner coil wound around at least one of the substrate layers and an aperture in said printed circuit board.

In another embodiment, the apparatus for measuring current in a conductor has a printed circuit board having a plurality of discrete substrate layers, a first coil wound around at least one of the discrete substrate layers, and a conductor traversing the center of the first coil.

In another embodiment, the apparatus for measuring current in a conductor has a printed circuit board having four discrete substrate layers, a first surface layer, a first inner layer, a second inner layer, and a second surface layer, an outer coil wound on the first surface layer and the second surface layer, and traversing the first surface layer, the first inner layer, the second inner layer, and the second surface layer and an inner coil wound on the first inner layer and the second inner layer, and traversing the first inner layer and a second inner layer.

DETAILED DESCRIPTION OF THE PREFERRED EMBODIMENT

The following detailed description and appended drawings describe and illustrate various exemplary embodiments of the invention. The description and drawings serve to enable one skilled in the art to make and use the invention, and are not intended to limit the scope of the invention in any manner. In respect of the methods disclosed, the steps presented are exemplary in nature, and thus, the order of the steps is not necessary or critical.

Figure 1:
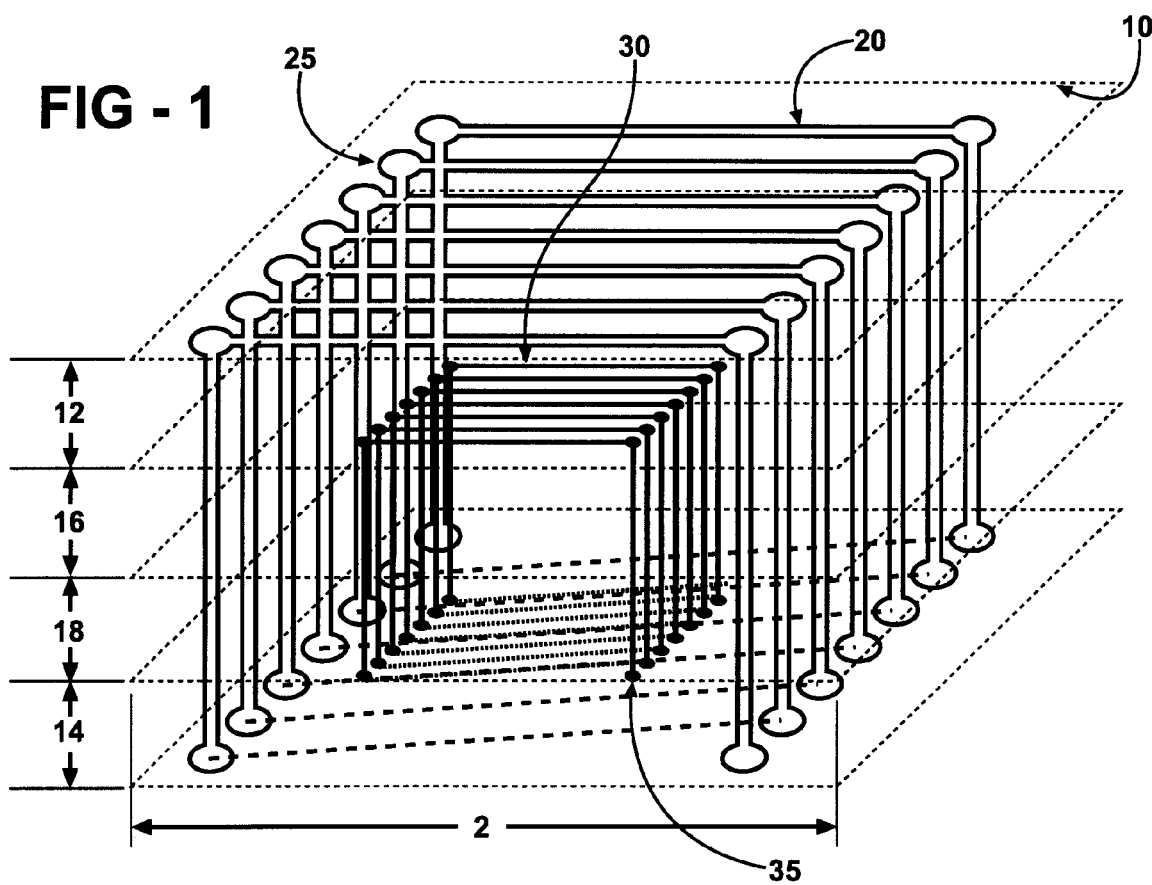
FIG. 1 is a perspective illustration of a portion of the Rogowski Coil printed circuit board according to an embodiment of the invention.

Referring now to the drawings, and particularly FIG. 1, there is shown generally at 2 a portion of a multi-layer printed circuit board. In this embodiment, the printed circuit board 2 includes a first surface layer 12, a second surface layer 14, a first inner layer 16, and a second inner layer 18 stacked together. In the embodiment shown, the layers 12, 14, 16, 18 of the printed circuit board 2 are constructed from an insulative circuit board substrate 10 adapted such that conductive traces may be deposited or etched using known photoresitive processes.

An outer coil 20 is wound in a first direction by disposing conductive traces on outer surfaces of the first surface layer 12 and the second surface layer 14. The traces are connected in a helical manner using a series of conductive plated outer coil via holes 25 that traverse the first surface layer 12, the second surface layer 14, the first inner layer 16, and the second inner layer 18 of the printed circuit board 2.

An inner coil 30 is wound in a second direction by disposing conductive traces on surfaces of the first inner layer 16 and the second inner layer 18 facing the layers 12 and 14 respectively. The inner coil 30 traces are connected in a helical manner using a series of conductive plated inner coil via holes 35 that traverse the first inner layer 16 and the second inner layer 18. The inner coil 30 windings in the second direction are electrically opposite to that of the first direction of the outer coil 20 windings. Additionally, the inner coil 30 is constructed with a higher-turn density than the outer coil 20 in order to compensate for the size difference between the outer coil 20 and inner coil 30. The outer coil 20 and the inner coil 30 are square-shaped in cross section. It is understood that other windings can be used as desired.

Figure 2:
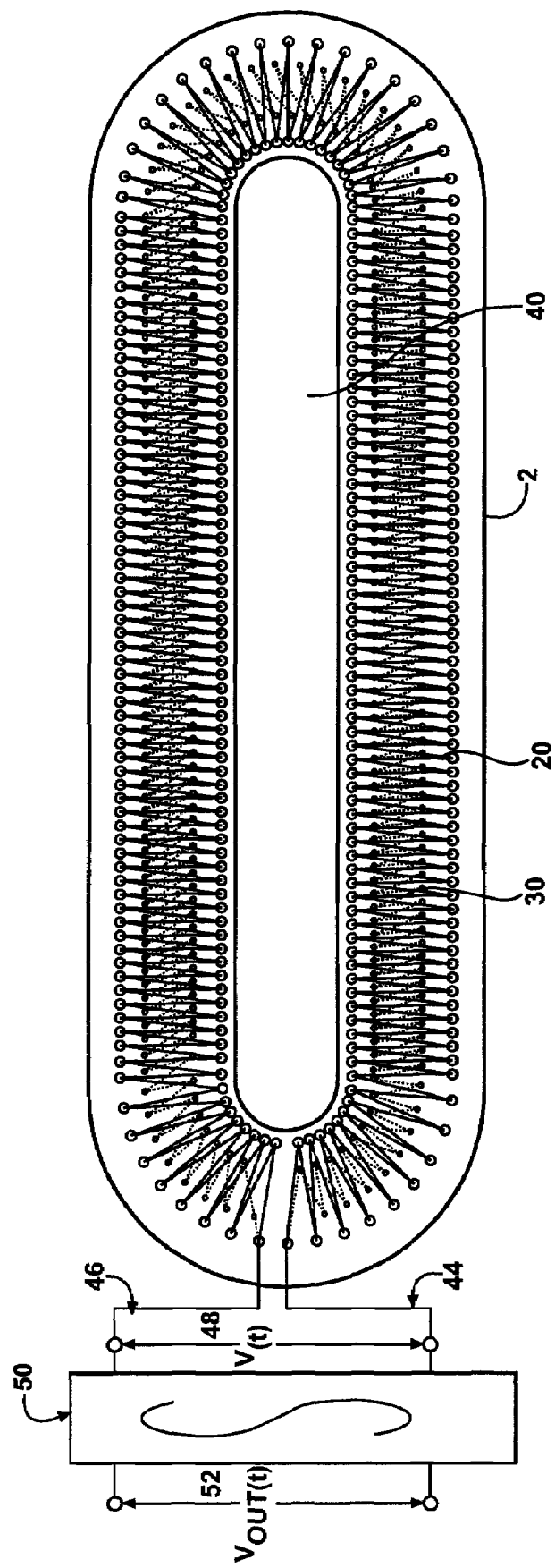
FIG. 2 is a plan view of a high performance Rogowski current transformer incorporating the circuit board of FIG. 1.

An aperture 40 is milled in the printed circuit board 2 as illustrated in FIG. 2. The aperture 40 is adapted to receive a solid conductive bus bar. The outer coil 20 and the inner coil 30 extend about the periphery of the aperture 40. Alternatively, the aperture 40 may be adapted to receive one or more various types of electrical conductors without departing from the scope of this invention.

Figure 3:
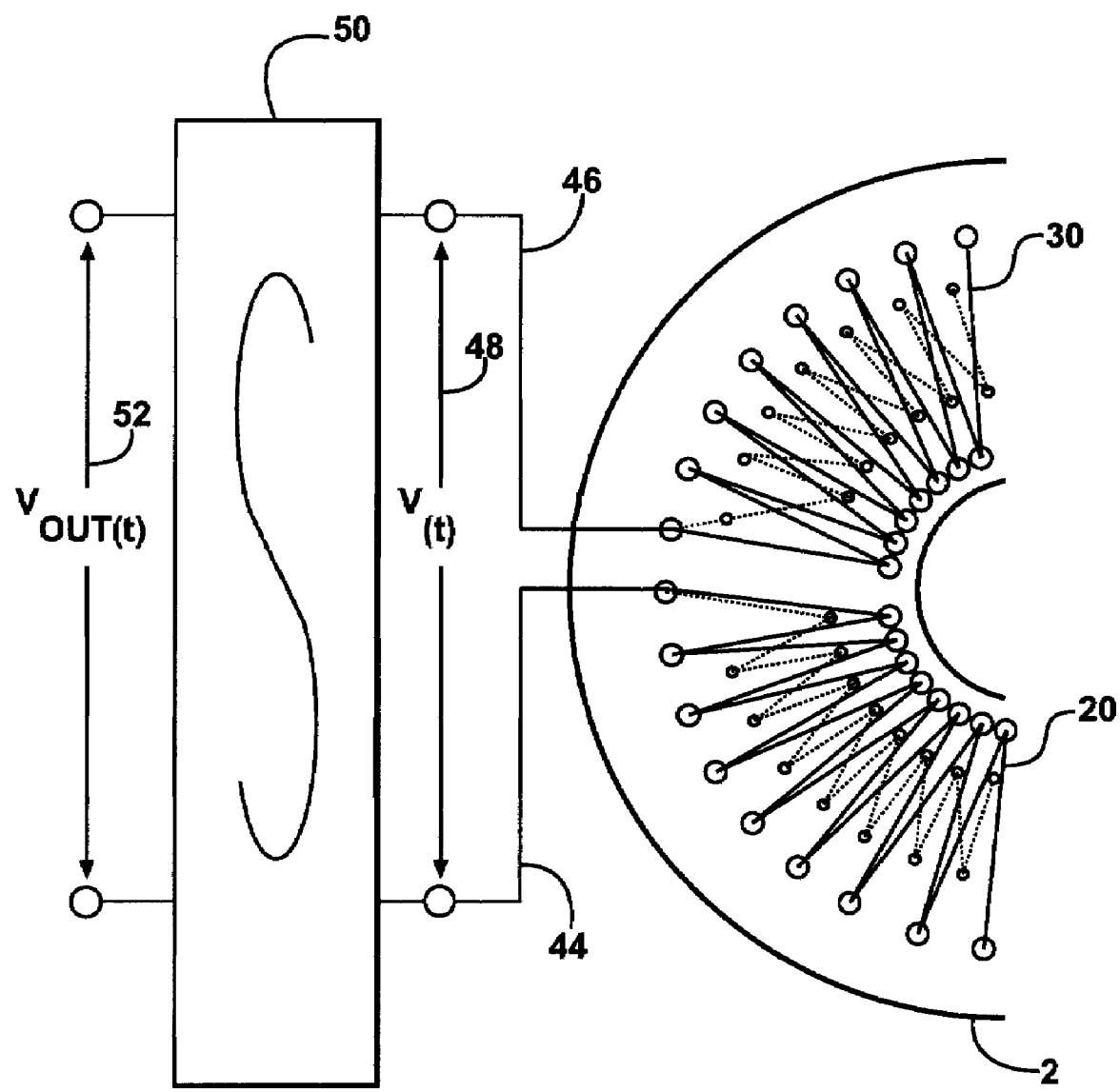
FIG. 3 is an enlarged view of a portion of the high-performance Rogowski current transformer of FIG. 2.

In FIG. 3, an integrator circuit 50 is linked to an output 48. The output 48 includes an electrical connection 46 to the outer coil 20, and an electrical connection 44 to the inner coil 44.

Figure 4:
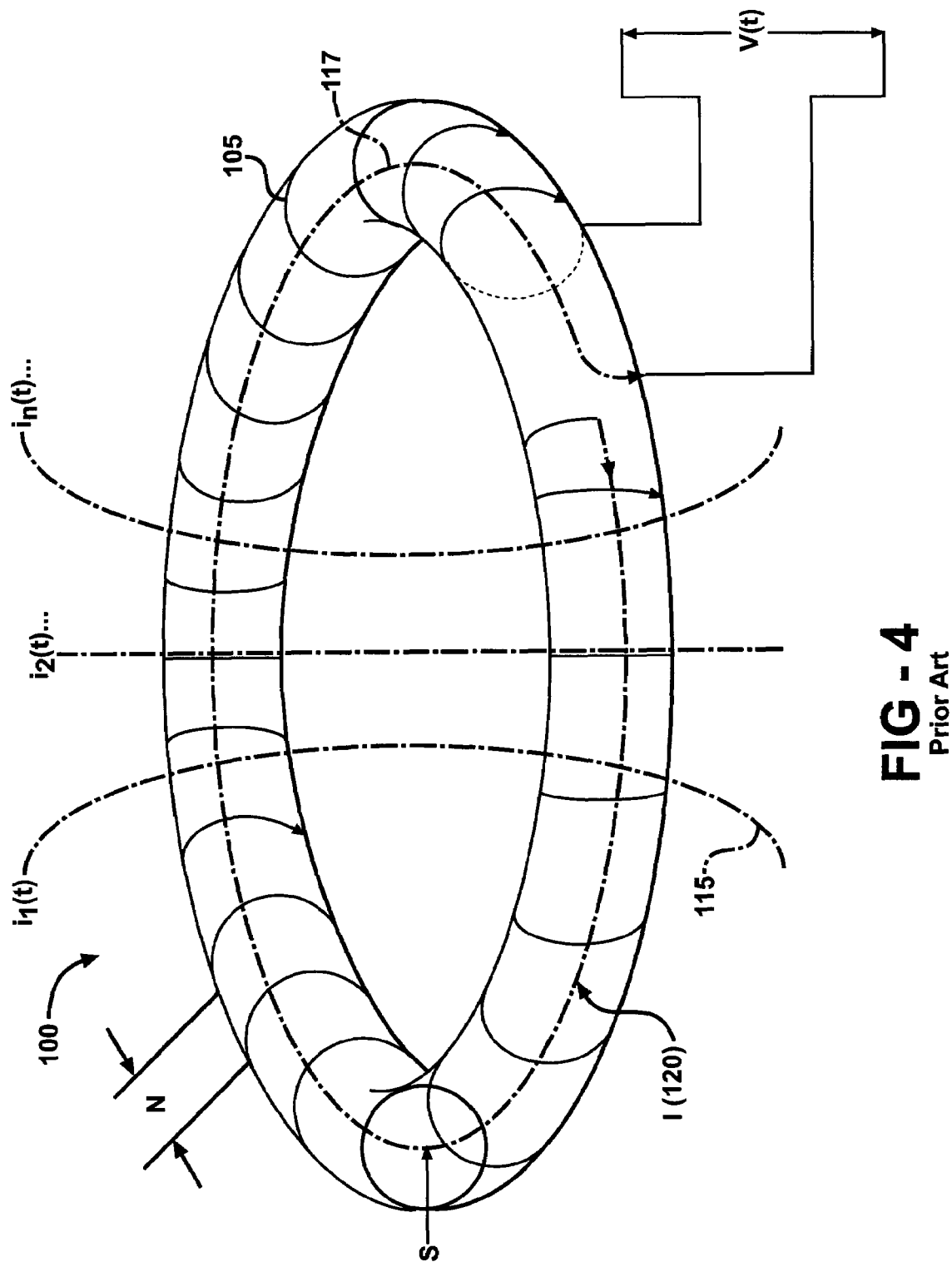
FIG. 4 is a perspective illustration of a basic Rogowski coil commonly known in the prior art.

In operation, the prior art Rogowski coil 100 is placed around one or more electrical conductors 115 whose instantaneous current i(t) is to be measured, as illustrated in FIG. 4.

The instantaneous current i(t) for alternating current waveforms is given by $I_{max} \sin(\omega t)$ where $I_{max}$ is the amplitude of the current. The voltage v(t) induced in the Rogowski coil 100 is defined by the first equation:

$$v(t) = -\frac{d}{dt}\left(\sum_{j=1}^{N} \phi_j\right) \quad 1)$$

where $\phi_j$ is the instantaneous flux for the j-th turn of the total N turns. If the core has a constant cross section S, the wire is wound perpendicularly to a line 120 that is centered in the cross section S, and the wire is wound with a constant density equal to n, where the mutual reactance M is defined by $M=u_o\eta S$, then equation 1 may be written as:

$$v(t) = -\mu_o n S \frac{d}{dt}\left[\sum_j i_{j(t)}\right] \quad 2)$$

According to the above equation the electrical conductor will induce a voltage on the Rogowski coil 100 proportional to the rate of change of the measured current i(t) in the electrical conductor. The Rogowski coil output voltage v(t) can be measured at output 48.

The voltage output of the Rogowski coil v(t) is a function of the time-rate-of-change of the AC current passing within the perimeter of the coils. The integrator circuit 50 is necessary in order to attain the actual waveform of interest which is an output voltage $v_{out}$ that is proportional to the measured current i(t). Output voltage integration may be performed using a variety of means commonly known in the art. The output voltage signal $v_{out}$ can be measured at the integrator output 52.

As shown in FIG. 1, there is a difference in size between the outer coil 20 and inner coil 30. This difference in size of the outer coil 20 and inner coil 30 results in a difference in induced voltage, both by the current of interest i(t) and by magnetic fields created by conductors outside the printed circuit board aperture 40. In order to compensate for this difference in induced voltage, it is desirable that the inner coil 30 is constructed with a higher turns density than the outer coil 20. The effective electrical geometries of the outer coil 20 and inner coil 20 can be made substantially identical by constructing the inner coil 30 with a higher turns density than the outer coil 20.

The maximum effective turns density is largely determined by the minimum achievable hole size during printed circuit board fabrication, and thicker printed circuit boards impose a larger minimum hole size constraint for plated vias. Therefore, the inner coil 30 can be constructed with a higher turns density, because the inner coil vias 35 traverse two substrate 10 layers, while the outer coil vias 25 traverse all four of the substrate 10 layers.

The outer coil 20 and inner coil 30 are wound in electrically opposite directions to cancel the undesirable electrical fields from outside of the aperture 40. This maximizes the accuracy of the measurement capability of the Rogowski Coil.

From the foregoing description, one ordinarily skilled in the art can easily ascertain the essential characteristics of this invention and, without departing from the spirit and scope thereof, make various changes and modifications to the invention to adapt it to various usages and conditions.

What is claimed is:

1. An apparatus for measuring the current in a conductor, comprising:
    a printed circuit board having at least three discrete substrate layers stacked together;
    a first coil wound around at least three of the discrete substrate layers; and
    a second coil traversing a center of the first coil, wherein the second coil is coaxially wound with the first coil.

2. The apparatus according to claim 1 wherein the second coil is wound around at least one of the discrete substrate layers.

3. The apparatus according to claim 1, further comprising an aperture formed in the printed circuit board and adapted to receive at least one conductor.

4. An apparatus for measuring current in a conductor, comprising:
    a printed circuit board having a plurality of stacked discrete substrate layers;
    an outer coil wound around at least three of the substrate layers;
    an inner coil wound around at least one of the substrate layers, wherein the inner coil is coaxially wound with the outer coil; and
    an aperture formed in the printed circuit board about which the outer coil and the inner coil extend.

5. The apparatus according to claim 4, wherein the printed circuit board includes four of the discrete substrate layers.

6. The apparatus according to claim 5, wherein the outer coil is constructed by disposing conductive traces on a first surface layer and a second surface layer of the discrete subsurface layers, and connecting said traces using plated holes that traverse the discrete substrate layers.

7. The apparatus according to claim 4, wherein the inner coil is constructed by disposing conductive traces across a first inner layer and a second inner layer of the discrete subsurface layers, and connecting said traces using plated holes that traverse the first inner layer and the second inner layer.

8. The apparatus according to claim 4, wherein the outer coil and the inner coil are wound in electrically opposite directions.

9. The apparatus according to claim 4, wherein the inner coil has a higher turn density than the outer coil.

10. The apparatus according to claim 4, further comprising an integrator circuit electrically connected to the inner coil and the outer coil.

11. The apparatus according to claim 4, wherein the aperture is elongated.

12. An apparatus for measuring the current in a conductor comprising:
    a printed circuit board having discrete substrate layers including a first surface layer, a first inner layer, a second inner layer, and a second surface layer;
    an outer coil disposed on the first surface layer and the second surface layer, and traversing the first surface layer, the first inner layer, the second inner layer, and the second surface layer; and
    an inner coil disposed on the first inner layer and the second inner layer, and traversing the first inner layer and a second inner layer.

13. The apparatus according to claim 12, further comprising an aperture formed in the printed circuit board about which the outer coil and the inner coil extend.

14. The apparatus according to claim 12, wherein the aperture is adapted to receive a conductor through which a current to be measured flows.

15. The apparatus according to claim 12, wherein the outer coil and the inner coil are wound in electrically opposite directions.

16. The apparatus according to claim 12, wherein the inner coil traverses the first inner layer and the second inner layer through a plurality of plated holes.

17. The apparatus according to claim 12, wherein the outer coil traverses the first surface layer, the second surface layer, the first inner layer, and the second inner layer through a plurality of holes.

18. The apparatus according to claim 12, wherein the inner coil has a higher turn density than the outer coil.

19. The apparatus according to claim 12, further comprising an integrator circuit electrically linked to the inner coil and outer coil.

20. The apparatus according to claim 12, further comprising an aperture formed in the printed circuit board and the inner coil and the outer coil extending about the aperture.

* * * * *